US012004363B2

(12) United States Patent
Li et al.

(10) Patent No.: US 12,004,363 B2
(45) Date of Patent: Jun. 4, 2024

(54) LIGHT-EMITTING STRUCTURE, DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dong Li, Beijing (CN); Wenhai Mei, Beijing (CN); Boris Kristal, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 719 days.

(21) Appl. No.: 17/255,569

(22) PCT Filed: Feb. 26, 2020

(86) PCT No.: PCT/CN2020/076750
§ 371 (c)(1),
(2) Date: Dec. 23, 2020

(87) PCT Pub. No.: WO2020/215882
PCT Pub. Date: Oct. 29, 2020

(65) Prior Publication Data
US 2021/0288281 A1   Sep. 16, 2021

(30) Foreign Application Priority Data
Apr. 26, 2019 (CN) .......................... 201910343913.6

(51) Int. Cl.
*H10K 50/16* (2023.01)
*C01B 25/08* (2006.01)
(Continued)

(52) U.S. Cl.
CPC ........... *H10K 50/16* (2023.02); *C01B 25/087* (2013.01); *C01G 9/006* (2013.01);
(Continued)

(58) Field of Classification Search
CPC .... H10K 50/16; H10K 50/165; H10K 50/115; H10K 2102/331; H10K 2101/30; B82Y 20/00
See application file for complete search history.

(56) References Cited

U.S. PATENT DOCUMENTS 11,342,527 B2   5/2022   Sakakibara et al.
2008/0206565 A1   8/2008   Takahashi et al.
(Continued)

FOREIGN PATENT DOCUMENTS

CN   106601923 A   4/2017
CN   109449317 A   3/2019
(Continued)

OTHER PUBLICATIONS

Extended European Search Report from European Patent Application No. 20795474.4 dated Dec. 8, 2022.
(Continued)

*Primary Examiner* — Tucker J Wright
(74) *Attorney, Agent, or Firm* — Dilworth & Barrese, LLP.; Michael J. Musella, Esq.

(57) ABSTRACT

A light-emitting structure, a display panel and a display device. The light-emitting structure comprises a first light-emitting element. The first light-emitting element comprises a first light-emitting layer, a first electron transport layer and a first cathode. The first cathode is in contact with the first electron transport layer. The energy level of conduction band minimum (CBM) of the first electron transport layer is greater than the Fermi level of the first cathode. A difference between the energy level of CBM of the first electron
(Continued)

transport layer and the Fermi level of the first cathode is in a range from 0.3 to 0.6 eV.

19 Claims, 2 Drawing Sheets

(51) Int. Cl.

| | | |
|---|---|---|
| C01G 9/00 | (2006.01) | |
| C09K 11/08 | (2006.01) | |
| C09K 11/70 | (2006.01) | |
| H10K 50/115 | (2023.01) | |
| B82Y 20/00 | (2011.01) | |
| H10K 101/30 | (2023.01) | |
| H10K 102/00 | (2023.01) | |

(52) U.S. Cl.
CPC .......... *C09K 11/0883* (2013.01); *C09K 11/70* (2013.01); *H10K 50/115* (2023.02); *B82Y 20/00* (2013.01); *C01P 2004/64* (2013.01); *C01P 2006/40* (2013.01); *H10K 2101/30* (2023.02); *H10K 2102/331* (2023.02)

(56) References Cited

U.S. PATENT DOCUMENTS

| | | |
|---|---|---|
| 2010/0244062 A1 | 9/2010 | Ueno |
| 2012/0138894 A1 | 6/2012 | Qian et al. |
| 2016/0276615 A1 | 9/2016 | Kitabayashi |
| 2021/0028385 A1* | 1/2021 | Sakakibara ............ H10K 59/12 |

FOREIGN PATENT DOCUMENTS

| | | |
|---|---|---|
| CN | 209434227 U | 9/2019 |
| EP | 3709773 A1 | 9/2020 |
| JP | 2008214363 A | 9/2008 |
| JP | 2009087752 A | 4/2009 |
| JP | 2009087784 A | 4/2009 |
| JP | 2012533156 A | 12/2012 |
| JP | 2013046040 A | 3/2013 |
| JP | 2016058172 A | 4/2016 |
| JP | 2016062745 A | 4/2016 |
| KR | 2016-0033520 A | 3/2016 |
| WO | 2019/186896 A1 | 10/2019 |

OTHER PUBLICATIONS

Zhang et al., ZnMgO:ZnO composites films for fast electron transport and high charge balance in quantum dot light emitting diodes, Optical Materials Express, vol. 8, No. 4, Mar. 15, 2018, pp. 909-918.

Kim et al., "Performance Improvement of Quantum Dot-Light-Emitting Diodes Enabled by an Alloyed ZnMgO Nanopaticle Electron Transport Layer," Chemistry of Materials, vol. 27, No. 1, Dec. 18, 2014, pp. 197-204.

Ashcroft N.W. et al, "Fermi Levels," XP093003423, Jan. 1, 2000, p. 1.

Zhang et al, "An ZnMgO PVP inorganic-organic hybrid electron transport layer towards efficient bottom-emission and transparent quantum dot light-emitting diodes" Jan. 23, 2019, pp. 2291-2298, Journal of Materials Chemistry.

Japanese Office Action issued by the Japanese Patent Office in Japanese Application No. 2020-572775; Mailing Date: Oct. 30, 2023.

* cited by examiner

LIGHT-EMITTING STRUCTURE, DISPLAY PANEL AND DISPLAY DEVICE

The application claims priority to the Chinese patent application No. 201910343913.6 filed on Apr. 26, 2019, the entire disclosure of which is incorporated herein by reference as part of the present application.

TECHNICAL FIELD

Embodiments of the present disclosure relates to a light-emitting structure, a display panel, and a display device.

BACKGROUND

With the development of display technology, there are more and more kinds of display devices. Light-Emitting Diode (LED) display device has attracted wide attention in the industry because of its advantages of self-illumination, high brightness, low working voltage, low power consumption, long life, impact resistance and stable performance. In addition, the light-emitting diode display device does not need to be additionally provided with a backlight module, and has lighter weight, thus being beneficial to the thinning of the display device, and therefore having better market prospects.

Quantum Dot (QD) is a new type of light-emitting material, which has the advantages of high color purity, high light-emitting quantum efficiency, adjustable light-emitting color and long service life, and has become a research hotspot of new LED light-emitting materials at present. Therefore, Quantum dot Light-Emitting Diode (QLED) with quantum dot material as the light-emitting layer has become the main research direction of new display devices.

SUMMARY

Embodiments of the present disclosure provide a light-emitting structure, a display panel, and a display device. The light-emitting structure includes a first light-emitting element, the first light-emitting element includes a first light-emitting layer, a first electron transport layer, and a first cathode, the first cathode is in contact with the first electron transport layer, an energy level of conduction band minimum (CBM) of the first electron transport layer is larger than a Fermi level of the first cathode, and a difference between the energy level of CBM of the first electron transport layer and the Fermi level of the first cathode is in a range from 0.3 to 0.6 eV. In this light-emitting structure, because the energy level of CBM of the first electron transport layer is larger than the Fermi level of the first cathode, electrons need to cross the potential barrier from the first cathode to the first electron transport layer, and the difference between the energy level of CBM of the first electron transport layer and the Fermi level of the first cathode is in a range from 0.3 to 0.6 eV, so that the electron injection efficiency of the first light-emitting element can be appropriately reduced and matched with the hole injection efficiency of the first light-emitting element, thereby improving the light-emitting efficiency and stability of the first light-emitting element.

At least one embodiment of the present disclosure provides a light-emitting structure, the light-emitting structure includes a first light-emitting element including a first light-emitting layer, a first electron transport layer, and a first cathode, the first cathode is in contact with the first electron transport layer, an energy level of conduction band minimum (CBM) of the first electron transport layer is larger than a Fermi level of the first cathode, and a difference between the energy level of CBM of the first electron transport layer and the Fermi level of the first cathode is in a range from 0.3 to 0.6 eV.

For example, in the light-emitting structure provided by an embodiment of the present disclosure, a material of the first light-emitting layer includes a cadmium-free quantum dot material, the first electron transport layer includes ZnMgO nanoparticles, and a molar percentage of Mg in the first electron transport layer is in a range from 10% to 20%.

For example, in the light-emitting structure provided by an embodiment of the present disclosure, the material of the first light-emitting layer includes indium phosphide.

For example, in the light-emitting structure provided by an embodiment of the present disclosure, the molar percentage of Mg in the first electron transport layer is in a range from 13% to 16%.

For example, in the light-emitting structure provided by an embodiment of the present disclosure, the light emitting structure further includes a second light-emitting element including a second light-emitting layer, a second electron transport layer, and a second cathode, the second cathode is in contact with the second electron transport layer, the energy level of CBM of the first light-emitting layer is smaller than that of the second light-emitting layer, and the energy level of CBM of the first electron transport layer is larger than that of the second electron transport layer.

For example, in the light-emitting structure provided by an embodiment of the present disclosure, a potential barrier of electrons from the first cathode to the first electron transport layer is larger than a potential barrier of electrons from the second cathode to the second electron transport layer.

For example, in the light-emitting structure provided by an embodiment of the present disclosure, the energy level of CBM of the first light-emitting layer is smaller than that of the first electron transport layer, the energy level of CBM of the second light-emitting layer is larger than that of the second electron transport layer, and the Fermi level of the second cathode is substantially equal to that of the second electron transport layer.

For example, in the light-emitting structure provided by an embodiment of the present disclosure, the first electron transport layer includes ZnMgO nanoparticles, the second electron transport layer includes ZnO nanoparticles or ZnMgO nanoparticles, and a molar percentage of Mg in the first electron transport layer is greater than a molar percentage of Mg in the second electron transport layer.

For example, in the light-emitting structure provided by an embodiment of the present disclosure, the molar percentage of Mg in the first electron transport layer is 10%-20%, and the molar percentage of Mg in the second electron transport layer is less than 5%.

For example, in the light-emitting structure provided by an embodiment of the present disclosure, at least one of the first light-emitting layer and the second light-emitting layer is a quantum dot light-emitting layer, and the first cathode and the second cathode are the same conductive layer.

For example, in the light-emitting structure provided by an embodiment of the present disclosure, the light-emitting structure further includes a third light-emitting element including a third light-emitting layer, a third electron transport layer, and a third cathode, the third cathode is in contact with the third electron transport layer, and an energy level of CBM of the third light-emitting layer is larger than that of the first light-emitting layer and smaller than that of the second light-emitting layer, an energy level of CBM of the third electron transport layer is smaller than that of the first electron transport layer and larger than that of the second electron transport layer.

For example, in the light-emitting structure provided by an embodiment of the present disclosure, a potential barrier of electrons from the third cathode to the third electron transport layer is larger than a potential barrier of electrons from the second cathode to the second electron transport layer and smaller than a potential barrier of electrons from the first cathode to the first electron transport layer.

For example, in the light-emitting structure provided by an embodiment of the present disclosure, the first electron transport layer includes ZnMgO nanoparticles, the second electron transport layer includes ZnO nanoparticles or ZnMgO nanoparticles, and the third electron transport layer includes ZnMgO nanoparticles, and a molar percentage of Mg in the third electron transport layer is smaller than a molar percentage of Mg in the first electron transport layer and larger than a molar percentage of Mg in the second electron transport layer.

For example, in the light-emitting structure provided by an embodiment of the present disclosure, the molar percentage of Mg in the first electron transport layer is in a range of 10%-20%, the molar percentage of Mg in the second electron transport layer is less than 5%, and the molar percentage of Mg in the third electron transport layer is in a range of 5%-10%.

For example, in the light-emitting structure provided by an embodiment of the present disclosure, an electron mobility of the first electron transport layer is smaller than that of the second electron transport layer.

For example, in the light-emitting structure provided by an embodiment of the present disclosure, an electron mobility of the third electron transport layer is larger than that of the first electron transport layer and smaller than that of the second electron transport layer.

For example, in the light-emitting structure provided by an embodiment of the present disclosure, the first light-emitting layer is configured to emit light of red and the second light-emitting layer is configured to emit light of blue.

For example, in the light-emitting structure provided by an embodiment of the present disclosure, the first light-emitting layer is configured to emit light of red, the second light-emitting layer is configured to emit light of blue, and the third light-emitting layer is configured to emit light of green.

At least one embodiment of the present disclosure provides a display panel, the display panel includes a plurality of light-emitting structures arranged in an array, each of the plurality of light-emitting structures is any one of the abovementioned light-emitting structures.

At least one embodiment of the present disclosure provides a display device, the display device includes the abovementioned display panel.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
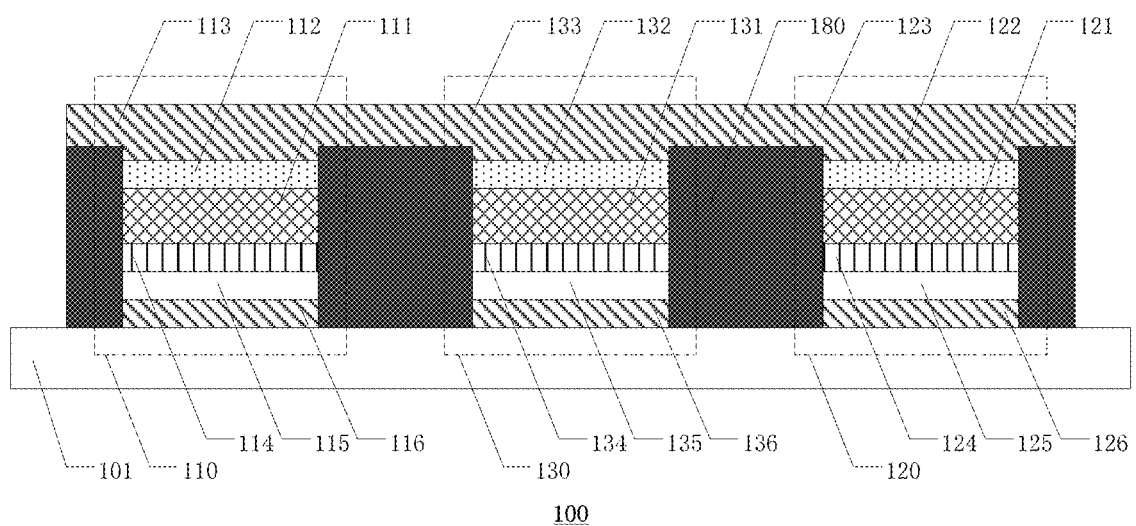
FIG. 1 is a schematic structural diagram of a light-emitting structure provided by an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In general QLED devices, for the quantum dot light-emitting layers of red and green, the electron injection efficiency is generally better than the hole injection efficiency due to the facts such as the energy level position of quantum dot materials, which leads to the number of electrons in carriers of the quantum dot light-emitting layers of red and green being larger than the number of holes in carriers of the quantum dot light-emitting layers of red and green. On the contrary, for the quantum dot light-emitting layer of blue, the electron injection efficiency is less than the hole injection efficiency, resulting in the number of holes in the carriers of the quantum dot light-emitting layer of blue being larger than the number of electrons in the carriers of the quantum dot light-emitting layer of blue. Therefore, the imbalance between electrons and holes in the quantum dot light-emitting layer in QLED devices will not only reduce the ability of the injected charges to be converted into excitons, but also make the charges accumulated in QLED devices, increase the non-radiation transition of charged excitons, thereby reducing the efficiency and the service life, thus becoming a bottleneck that limits the further improvement of the efficiency and stability of QLED devices.

In this regard, embodiments of the present disclosure provide a light-emitting structure, a display panel, and a display device. The light-emitting structure includes a first light-emitting element; the first light-emitting element includes a first light-emitting layer, a first electron transport layer, and a first cathode; the first cathode is in contact with the first electron transport layer, an energy level of conduction band minimum (CBM) of the first electron transport layer is larger than a Fermi level of the first cathode, and a difference between the energy level of CBM of the first electron transport layer and the Fermi level of the first cathode in a range from 0.3 to 0.6 eV. In this light-emitting structure, because the energy level of CBM of the first electron transport layer is larger than the Fermi level of the first cathode, electrons need to cross the potential barrier from the first cathode to the first electron transport layer, and the difference between the energy level of CBM of the first electron transport layer and the Fermi level of the first cathode is in a range from 0.3 eV to 0.6 eV, so that the electron injection efficiency of the first light-emitting element can be appropriately reduced and matched with the hole injection efficiency of the first light-emitting element, thereby improving the light-emitting efficiency and stability of the first light-emitting element.

Hereinafter, the light-emitting structure, the display panel, and the display device provided by the embodiments of the present disclosure will be described with reference to the drawings.

FIG. 1 is a schematic structural diagram of a light-emitting structure provided by an embodiment of the present disclosure. As illustrated by FIG. 1, the light-emitting structure 100 includes a first light-emitting element 110; the first light-emitting element 110 includes a first light-emitting layer 111, a first electron transport layer 112, and a first cathode 113; the first cathode 113 is in contact with the first electron transport layer 112, and is used to supply electrons when the first light-emitting element 110 emits light. An energy level of CBM of the first electron transport layer 112 is larger than a Fermi level of the first cathode 113, and a difference between the energy level of CBM of the first electron transport layer 112 and the Fermi level of the first cathode 113 is in a range from 0.3 eV to 0.6 eV. It should be noted that the above-mentioned "contact" refers to the case of direct contact, and no other film structure is arranged between the first cathode and the first electron transport layer.

In the light-emitting structure provided by the embodiment of the present disclosure, in the case where the electron injection efficiency of the first light-emitting layer is better than the hole injection efficiency the first light-emitting layer, because the energy level of CBM of the first electron transport layer is larger than the Fermi level of the first cathode, electrons need to cross the potential barrier from the first cathode to the first electron transport layer, and the difference between the energy level of CBM of the first electron transport layer and the Fermi level of the first cathode is in a range from 0.3 eV to 0.6 eV, so that the electron injection efficiency of the first light-emitting element can be appropriately reduced and matched with the hole injection efficiency of the first light-emitting element, thereby improving the light-emitting efficiency and stability of the first light-emitting element.

For example, in some exemplary embodiments, as illustrated by FIG. 1, the first light-emitting layer 111 is in contact with the first electron transport layer 112, that is, the first light-emitting element 110 is not provided with an electron injection layer, so that a thickness of the first light-emitting element 110 can be reduced while the electron injection efficiency of the first light-emitting element 110 is reduced, thereby providing a thinner light-emitting structure.

For example, in some exemplary embodiments, the first light-emitting layer 111 may be a quantum dot light-emitting layer of red. Because the electron injection efficiency of the quantum dot light-emitting layer of red is generally better than the hole injection efficiency of the quantum dot light-emitting layer of red, the holes and electrons in the carriers of the quantum dot light-emitting layer of red are very unbalanced; in the light-emitting structure provided by the embodiment of the present disclosure, the energy level of CBM of the first electron transport layer is larger than the Fermi level of the first cathode by selecting appropriate materials, and the difference between the energy level of CBM of the first electron transport layer and the Fermi level of the first cathode is in a range from 0.3 eV to 0.6 eV, so that the electron injection efficiency and hole injection efficiency of the first light-emitting element are matched, thereby improving the light-emitting efficiency and stability of the first light-emitting element.

For example, in some exemplary embodiments, a material of the first light-emitting layer 111 may include a cadmium-free quantum dot material, thereby reducing the pollution to the environment. The first electron transport layer 112 includes ZnMgO nanoparticles, i.e., ZnO nanoparticles doped with Mg, and the molar percentage of Mg in the first electron transport layer 112 is in a range from 10% to 20%, so that the difference between the energy level of CBM of the first electron transport layer 112 and the Fermi level of the first cathode 113 can be in the range of 0.3 eV to 0.6 eV.

For example, in some exemplary embodiments, a material of the first cathode 113 may be silver or aluminum. Therefore, the Fermi level of the first cathode 113 may be in a range from −4.3 eV to −4.2 eV.

For example, in some exemplary embodiments, the material of the first light-emitting layer 111 may include indium phosphide (InP), and the molar percentage of Mg in the first electron transport layer 112 is in a range from 13% to 16%. In this case, the energy level of CBM of the first electron transport layer 112 is approximately −3.83 eV, and the Fermi level of the first cathode 113 can be in a range from −4.3 to −4.2 eV, so that the difference between the energy level of CBM of the first electron transport layer 112 and the Fermi level of the first cathode 113 is approximately in the range from 0.37 eV to 0.47 eV. In this case, the light-emitting efficiency and stability of the first light-emitting element 110 can be greatly increased.

Figure 2:
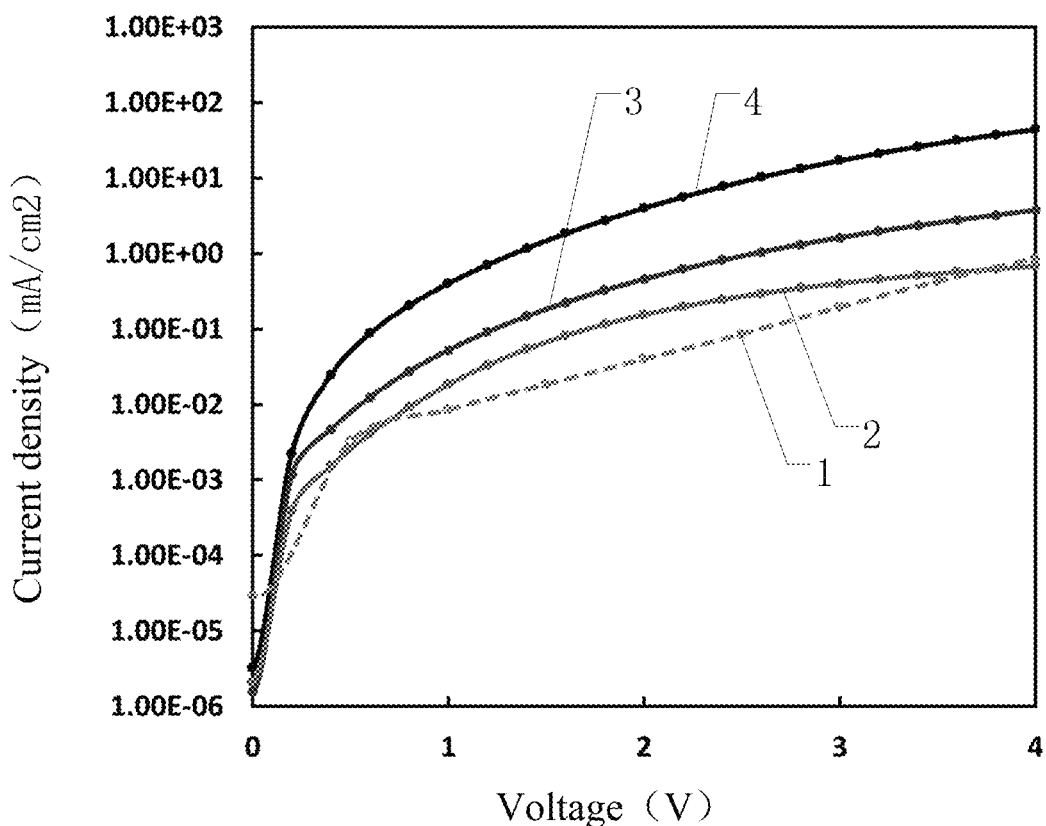
FIG. 2 is a comparison diagram of electron injection efficiency and hole injection efficiency of a first light-emitting element, adopting different electron transport layers, of a light-emitting structure provided by an embodiment of the present disclosure.
Figure 3:
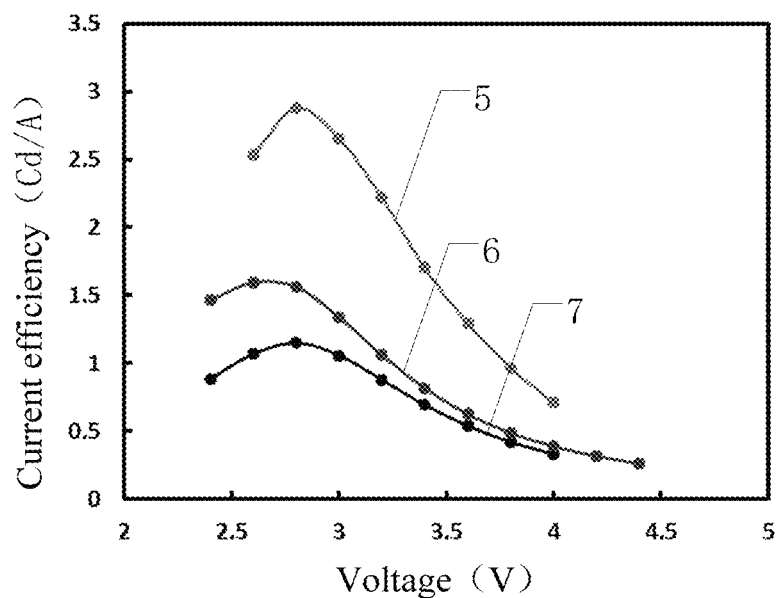
FIG. 3 is a comparison diagram of current efficiency of a first light-emitting element, adopting different electron transport layers, of a light-emitting structure provided by an embodiment of the present disclosure.

FIG. 2 is a comparison diagram of electron injection efficiency and hole injection efficiency of a first light-emitting element of a light-emitting structure provided by an embodiment of the present disclosure; FIG. 3 is a comparison diagram of a current efficiency of the first light-emitting element of a light-emitting structure, adopting different electron transport layers, provided by an embodiment of the present disclosure. The first light-emitting element in FIG. 2 and FIG. 3 is a quantum dot light-emitting element of red, and the first light-emitting layer is made of indium phosphide (InP).

As illustrated by FIG. 2, curve 1 is a hole injection efficiency of the first light-emitting element; curve 2 illustrates an electron injection efficiency of the first light-emitting element in which the electron transport layer adopts ZnMgO nanoparticles with Mg of 15% in molar percentage; curve 3 illustrates an electron injection efficiency of the first light-emitting element in which the electron transport layer adopts ZnMgO nanoparticles with Mg of 5% in molar percentage; curve 4 illustrates an electron injection efficiency of the first light-emitting element in which the electron transport layer adopts ZnO nanoparticles or ZnMgO nanoparticles with Mg of 0% in molar percentage, that is, ZnO nanoparticles. The experimental results show that the electron injection efficiency illustrated by curve 2 is more matched with the hole injection efficiency illustrated by curve 1, which is beneficial to improving the light-emitting efficiency and stability of the first light-emitting element. It should be noted that the hole injection efficiency of curve 1 is measured in the case where the first light-emitting element only includes a light-emitting layer and a hole transport layer; the electron injection efficiency of curve 2 is a curve measured in the case where the first light-emitting element only includes a light-emitting layer and an electron transport layer; the electron injection efficiency of curve 3 is a curve measured in the case where the first light-emitting element only includes a light-emitting layer and an electron transport layer; the electron injection efficiency of curve 4 is a curve measured in the case where the first light-emitting element only includes a light-emitting layer and an electron transport layer.

As illustrated by FIG. 3, curve 5 is a current efficiency of the first light-emitting element in which the electron transport layer adopts ZnMgO nanoparticles with Mg of 15% in molar percentage; curve 6 is a current efficiency of the first light-emitting element in which the electron transport layer adopts ZnMgO nanoparticles with Mg of 5% in molar percentage; curve 7 illustrates a current efficiency of the first light-emitting element in which the electron transport layer adopts ZnO nanoparticles or ZnMgO nanoparticles with Mg of 0% in molar percentage, that is, ZnO nanoparticles. The experimental results show that the current efficiency of the first light-emitting element illustrated by curve 5 is obviously higher than that of curve 6 and curve 7. Furthermore, with the increase of the molar percentage of Mg, the current efficiency of the first light-emitting element illustrated by curve 5 does not increase linearly, but suddenly changes, which is much higher than that of curve 6 and curve 7. Therefore, in the case where the electron transport layer adopts ZnMgO nanoparticles with Mg of 15% in molar percentage, the first light-emitting element has higher current efficiency. It should be noted that other films (for example, hole transport layer, etc.) of the first light-emitting element illustrated by curves 5, 6 and 7 all adopt the same material and structure.

For example, in some exemplary embodiments, as illustrated by FIG. 1, the first light-emitting element 110 further includes a first hole transport layer 114, a first hole injection layer 115, and a first anode 116. The first hole transport layer 114 is arranged at a side of the first light-emitting layer 111 away from the first electron transport layer 112, the first hole injection layer 115 is arranged at a side of the first hole injection layer 114 away from the first hole transport layer 114, and the first anode 116 is arranged at a side of the first hole injection layer 115 away from the first hole transport layer 114.

For example, the first anode 116 may use a transparent conductive oxide or a conductive polymer, and the transparent conductive oxide may be indium tin oxide (ITO), FTO ($SnO_2$), etc. In addition, the materials of the first hole transport layer 114 and the first hole injection layer 115 may be selected according to actual conditions, and the embodiments of the present disclosure are not limited here.

For example, in some exemplary embodiments, as illustrated by FIG. 1, the light-emitting structure further includes a base substrate 101 for supporting the first light-emitting element 110 described above. For example, the base substrate 101 may be a transparent substrate such as a glass substrate, a quartz substrate, a plastic substrate, and the like. The base substrate 101 may also be a flexible transparent substrate such as a polyethylene terephthalate (PET) substrate.

For example, in some exemplary embodiments, as illustrated by FIG. 1, the light-emitting structure 100 further includes a second light-emitting element 120. The first light-emitting element 110 and the second light-emitting element 120 may be used to emit light of different colors. The second light-emitting element 120 includes a second light-emitting layer 121, a second electron transport layer 122, and a second cathode 123. The second cathode 123 is in contact with the second electron transport layer 122. The energy level of CBM of the first light-emitting layer 111 is smaller than that of the second light-emitting layer 121, and the energy level of CBM of the first electron transport layer 112 is larger than that of the second electron transport layer 122.

In the light-emitting structure provided by this exemplary embodiment, different light-emitting elements (e.g., the first light-emitting element and the second light-emitting element) adopt electron transport layers made of different materials. Because the energy level of CBM of the first light-emitting layer 111 is smaller than that of the second light-emitting layer 121, the difficulty of electrons from the first electron transport layer 112 to the first light-emitting layer 111 is smaller than that of electrons from the second electron transport layer 122 to the second light-emitting layer 121. Because the energy level of CBM of the first electron transport layer 112 is larger than that of the second electron transport layer 122, in the case where the Fermi levels of the first cathode 113 and the second cathode 123 are approximately the same, the potential barrier of electrons from the first cathode 113 to the first transport layer 112 is larger than that of electrons from the second cathode 123 to the second transport layer 122, which reduces the efficiency of electrons injected into the first light-emitting layer 111 to a certain extent, so as to reach a balance with the efficiency of holes injected into the first light-emitting layer 111. In addition, because the energy level of CBM of the first electron transport layer 112 is larger than that of the second electron transport layer 122, the light-emitting structure provided by this exemplary embodiment can also reduce the potential barrier of electrons from the second cathode 123 to the second electron transport layer 122, and improve the efficiency of electrons injected into the second light-emitting layer 121 to a certain extent, so as to reach a balance with the efficiency of holes injected into the second light-emitting layer 121, thereby further improving the light-emitting efficiency and stability of the first light-emitting element 110 and the second light-emitting element 120 at the same time.

For example, in some exemplary embodiments, the first cathode 113 and the second cathode 123 are the same conductive layer, that is, the first light-emitting element 110 and the second light-emitting element 120 share the same cathode layer. In this case, the potential barrier of electrons from the first cathode 113 to the first electron transport layer 112 is larger than the potential barrier of electrons from the second cathode 123 to the second electron transport layer 122.

Figure 4:
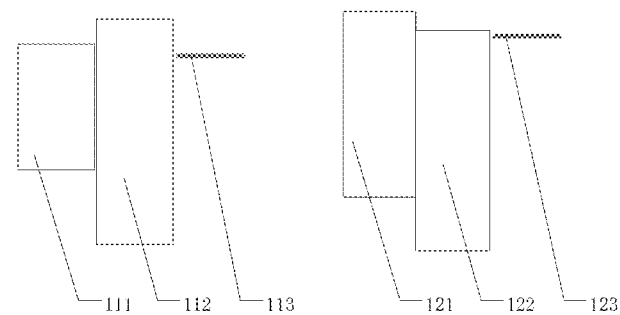
FIG. 4 is a schematic diagram of energy levels of different light-emitting layers and different electron transport layers in a light-emitting structure provided by an embodiment of the present disclosure.

FIG. 4 is a schematic diagram of energy levels of different light-emitting layers and different electron transport layers in a light-emitting structure provided by an embodiment of the present disclosure. As illustrated by FIG. 4, the energy level of CBM of the first light-emitting layer 111 is smaller than that of the first electron transport layer 112, and the energy level of CBM of the second light-emitting layer 121 is larger than that of the second electron transport layer 122. that is to say, there is no or almost no potential barrier for electrons from the first electron transport layer 112 to the first light-emitting layer 111, while electrons need to cross a potential barrier from the second electron transport layer 122 to the second light-emitting layer 121. In this case, the Fermi level of the second cathode 123 is approximately equal to the energy level of CBM of the second electron transport layer 122, that is, there is no or almost no potential barrier for electrons from the second cathode 123 to the second electron transport layer 122. Therefore, the light-emitting structure can improve the efficiency of electrons injected from the second cathode 123 to the second light-emitting layer 121 to a certain extent, so as to reach a balance with the efficiency of holes injected into the second light-emitting layer 121, thereby improving the light-emitting efficiency and stability of the second light-emitting element 120. It should be noted that the Fermi level of the second cathode is approximately equal to the energy level of CBM of the second electron transport layer, which refers to that a ratio of the difference between Fermi level of the second cathode and energy level of CBM of the second electron transport layer to an absolute value of Fermi level of the second cathode is within 4%.

For example, in some exemplary embodiments, the first electron transport layer 112 includes ZnMgO nanoparticles, and the second electron transport layer 122 includes ZnO nanoparticles or ZnMgO nanoparticles, and the molar percentage of Mg in the first electron transport layer 112 is greater than that in the second electron transport layer 122.

For example, in some exemplary embodiments, the molar percentage of Mg in the first electron transport layer 112 is in a range from 10% to 20%, and the molar percentage of Mg in the second electron transport layer 122 is less than 5%. It should be noted that in the case where the second electron transport layer 122 is ZnO nanoparticles, it can be considered that the second electron transport layer 122 is ZnMgO nanoparticles with Mg of 0% in molar percentage.

Table 1 is an energy level data table of an electron transport layer provided by an embodiment of the present disclosure. In table 1, the first electron transport layer 112 is ZnMgO nanoparticles with Mg of 15% in molar percentage, and the second electron transport layer 122 is ZnMgO nanoparticles with Mg of 0% in molar percentage. It can be seen that the energy level of CBM of the first electron transport layer 112 is larger than that of the second electron transport layer 122. In the case where the Fermi levels of the first cathode 113 and the second cathode 123 are in the range from −4.3 eV to −4.2 eV, the difference between the energy level of CBM of the first electron transport layer 112 and the Fermi level of the first cathode 113 is approximately in the range from 0.37 eV to 0.47 eV, and the difference between the energy level of CBM of the second electron transport layer 122 and the Fermi level of the second cathode 123 is less than 0.1 eV. Therefore, the light-emitting structure can reduce the efficiency of electrons injected into the first light-emitting layer 111 to a certain extent, so as to reach a balance with the efficiency of holes injected into the first light-emitting layer 111. And the efficiency of electrons injected into the second light-emitting layer 121 is improved to a certain extent, which is in balance with the efficiency of holes injected into the second light-emitting layer 121.

TABLE 1

Energy Level Data Table of Electron Transport Layer

| | Band gap/eV | Energy level of valence band maximum (VBM)/eV | Energy level of CBM/eV |
|---|---|---|---|
| First electron transport layer | 3.69 | −7.52 | −3.83 |
| Second electron transport layer | 3.61 | −7.9 | −4.29 |

For example, in some exemplary embodiments, an electron mobility of the first electron transport layer 112 is smaller than that of the second electron transport layer 122, which also reduces the efficiency of electrons injected into the first light-emitting layer 111 to a certain extent, so as to reach a balance with the efficiency of holes injected into the first light-emitting layer 111. The efficiency of electrons injected into the second light-emitting layer 121 is improved to a certain extent, which is in balance with the efficiency of holes injected into the second light-emitting layer 121. For example, in the case where the first electron transport layer 112 is ZnMgO nanoparticles with Mg of 15% in molar percentage and the second electron transport layer 122 is ZnMgO nanoparticles with Mg of 0% in molar percentage, the electron mobility of the first electron transport layer 112 is smaller than that of the second electron transport layer 122.

For example, in some exemplary embodiments, at least one of the first light-emitting layer and the second light-emitting layer is a quantum dot light-emitting layer. For example, the first light-emitting layer may be a quantum dot light-emitting layer of red, and the second light-emitting layer may be a quantum dot light-emitting layer of blue. The first light-emitting layer can adopt red cadmium-free quantum dot light-emitting material, such as indium phosphide (InP), such as core-shell quantum dot material of InP/ZnS. The second light-emitting layer can adopt blue quantum dot light-emitting material, such as cadmium selenide (CdSe), such as core-shell quantum dot material of CdSe/ZnS.

For example, in some exemplary embodiments, as illustrated by FIG. 1, the second light-emitting element 120 further includes a second hole transport layer 124, a second hole injection layer 125, and a second anode 126. The second hole transport layer 124 is disposed at a side of the second light-emitting layer 121 away from the second electron transport layer 122, the second hole injection layer 125 is disposed at a side of second hole injection layer 124 away from the second light-emitting layer 121, and the second anode 126 is disposed at a side of the second hole injection layer 125 away from the second hole transport layer 124.

For example, the second anode 126 may use transparent conductive oxide or conductive polymer, and the transparent conductive oxide may be indium tin oxide (ITO), FTO ($SnO_2$), etc. In addition, the materials of the second hole transport layer 124 and the second hole injection layer 125 can be selected according to actual conditions, and no limitation is imposed here in the embodiments of the present disclosure.

For example, in some exemplary embodiments, as illustrated by FIG. 1, the first light-emitting element 110 and the second light-emitting element 120 are disposed on the base substrate 101 in the same layer. That is, the first anode 116 of the first light-emitting element 110 and the second anode 126 of the second light-emitting element 120 may be arranged in the same layer; The first hole injection layer 115 of the first light-emitting element 110 and the second hole injection layer 125 of the second light-emitting element 120 may be disposed in the same layer. The first hole transport layer 114 of the first light-emitting element 110 and the second hole transport layer 124 of the second light-emitting element 120 may be arranged in the same layer. The first light-emitting layer 111 of the first light-emitting element 110 and the second light-emitting layer 121 of the second light-emitting element 120 may be arranged in the same layer. The first electron transport layer 112 of the first light-emitting element 110 and the second electron transport layer 122 of the second light-emitting element 120 may be disposed in the same layer. It should be noted that the first hole injection layer 115 and the second hole injection layer 125 may have different thicknesses according to actual conditions. The first hole transport layer 114 and the second hole transport layer 124 may have different thicknesses according to actual conditions.

For example, because the first anode 116 and the second anode 126 can be made of the same material, the first anode 116 and the second anode 126 can be formed by patterning the same conductive layer.

For example, the base substrate 101 may be a transparent substrate such as a glass substrate, a quartz substrate, a plastic substrate, and the like. The base substrate 101 may also be a flexible transparent substrate such as a polyethylene terephthalate (PET) substrate.

For example, in some exemplary embodiments, as illustrated by FIG. 1, the light-emitting structure 100 further includes a third light-emitting element 130. The third light-emitting element 130 includes a third light-emitting layer 131, a third electron transport layer 132, and a third cathode 133. The third cathode 133 is in contact with the third electron transport layer 132. The energy level of CBM of the third light-emitting layer 131 is larger than that of the first light-emitting layer 111 and smaller than that of the second light-emitting layer 121. The energy level of CBM of the third electron transport layer 132 is smaller than that of the first electron transport layer 112 and larger than that of the second electron transport layer 122.

In the light-emitting structure provided by this exemplary embodiment, different light-emitting elements (e.g., the first light-emitting element and the second light-emitting element) adopt electron transport layers of different materials. Because the energy level of CBM of the third light-emitting layer 131 is larger than that of the first light-emitting layer 111 and smaller than that of the second light-emitting layer 121, that is, the energy level of CBM of the third light-emitting layer 131 is between the first light-emitting layer 111 and the second light-emitting layer 121, the difficulty of electrons from the third electron transport layer 132 to the third light-emitting layer 131 is also between the difficulty of electrons from the first electron transport layer 112 to the first light-emitting layer 111 and the difficulty of electrons from the second electron transport layer 122 to the second light-emitting layer 121. Because the energy level of CBM of the third electron transport layer 132 is smaller than that of the first electron transport layer 112 and larger than that of the second electron transport layer 122, in the case where Fermi levels of the first cathode 113, the second cathode 123, and the third cathode 133 are approximately the same, a potential barrier of electrons from the third cathode 133 to the third transport layer 132 is smaller than that of electrons from the first cathode 113 to the first electron transport layer 112 and larger than that of electrons from the second cathode 123 to the second electron transport layer 122, thus the efficiency of electrons injected into the third light-emitting layer 131 is reduced to a certain extent, so as to reach a balance with the efficiency of holes injected into the third light-emitting layer 131, thereby improving the light-emitting efficiency and stability of the first light-emitting element 110, the second light-emitting element 120 and the third light-emitting element 130 at the same time.

For example, in some exemplary embodiments, the first cathode 113, the second cathode 123, and the third cathode 133 are the same conductive layer, that is, the first light-emitting element 110, the second light-emitting element 120, and the third light-emitting element 130 share the same cathode layer. The potential barrier of electrons from the third cathode 133 to the third electron transport layer 132 is larger than that of electrons from the second cathode 123 to the second electron transport layer 122 and smaller than that of electrons from the first cathode 113 to the first electron transport layer 112.

Figure 5:
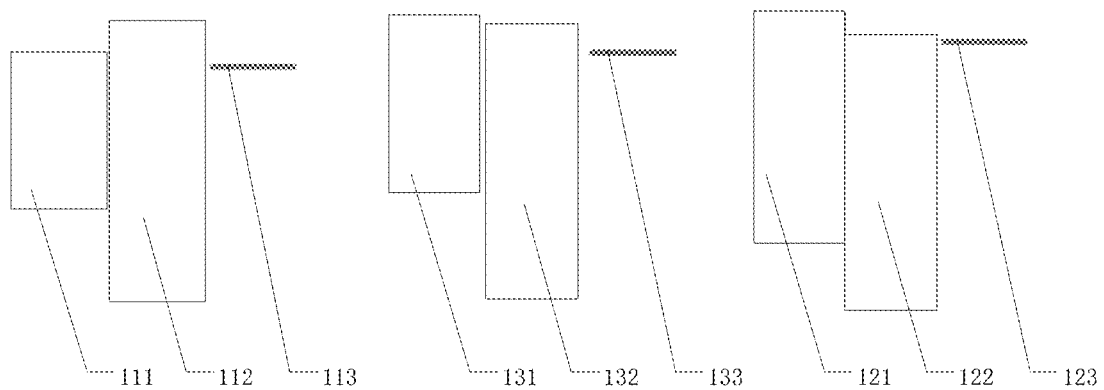
FIG. 5 is a schematic diagram of energy levels of different light-emitting layers and different electron transport layers in another light-emitting structure provided by an embodiment of the present disclosure.

FIG. 5 is a schematic diagram of energy levels of different light-emitting layers and different electron transport layers in another light-emitting structure provided by an embodiment of the present disclosure. As illustrated by FIG. 5, the energy level of CBM of the first light-emitting layer 111 is smaller than that of the first electron transport layer 112, the energy level of CBM of the second light-emitting layer 121 is larger than that of the second electron transport layer 122, and the energy level of CBM of the third light-emitting layer 131 is slightly larger than that of the third electron transport layer 132. That is to say, there is no or almost no potential barrier for electrons from the first electron transport layer 112 to the first light-emitting layer 111; electrons from the second electron transport layer 122 to the second light-emitting layer 121 need to cross a larger potential barrier (compared to the third light-emitting element); and electrons from the third electron transport layer 132 to the third light-emitting layer 131 need to cross a smaller potential barrier. In this case, the potential barrier of electrons from the first cathode 113 to the first electron transport layer 112 is large, there is no or almost no potential barrier for electrons from the second cathode 123 to the second electron transport layer 122, and the potential barrier of electrons from the third cathode 133 to the third electron transport layer 132 is small. Therefore, the light-emitting structure can relatively largely reduce the efficiency of electrons injected from the first cathode 113 to the first light-emitting layer 111, slightly reduce the efficiency of electrons injected from the third cathode 133 to the third light-emitting layer 131, and improve the efficiency of electrons injected from the second cathode 123 to the second light-emitting layer 121, thus achieving a balance in efficiency of holes and electrons that are respectively injected into the first light-emitting layer 111, the second light-emitting layer 121, and the third light-emitting layer 131, and improving light-emitting efficiency and stability of the light-emitting structure.

For example, in some exemplary embodiments, the first electron transport layer 112 includes ZnMgO nanoparticles, the second electron transport layer 122 includes ZnO nanoparticles or ZnMgO nanoparticles, and the third electron transport layer 132 includes ZnMgO nanoparticles. The molar percentage of Mg in the third electron transport layer 132 is smaller than that in the first electron transport layer 112 and larger than that in the second electron transport layer 122.

For example, in some exemplary embodiments, the molar percentage of Mg in the first electron transport layer 112 is in a range from 10% to 20%, the molar percentage of Mg in the second electron transport layer 122 is less than 5%, and the molar percentage of Mg in the third electron transport layer 132 is in a range from 5% to 10%. It should be noted that in the case where the second electron transport layer 122 is ZnO nanoparticles, it can be considered that the second electron transport layer 122 is ZnMgO nanoparticles with Mg of 0% in molar percentage.

Table 2 is an energy level data table of another electron transport layer provided by an embodiment of the present disclosure. In table 2, the first electron transport layer 112 is ZnMgO nanoparticles with Mg of 15% in molar percentage, the second electron transport layer 122 is ZnMgO nanoparticles with Mg of 0% in molar percentage, and the third electron transport layer 132 is ZnMgO nanoparticles with Mg of 5% in molar percentage. It can be seen that the energy level of CBM of the first electron transport layer 112 is greater than that of the third electron transport layer 132, the energy level of CBM of the third electron transport layer 132 is greater than that of the second electron transport layer 122. In the case where the Fermi levels of the first cathode 113, the second cathode 123, and the third cathode 133 are in the range from −4.3 eV to −0.2 eV, a difference between the energy level of CBM of the first electron transport layer 112 and the Fermi level of the first cathode 113 is approximately in the range from 0.37 eV to 0.47 eV, a difference between the energy level of CBM of the second electron transport layer 122 and the Fermi level of the second cathode 123 is less than 0.1 eV, and a difference between the energy level of CBM of the third electron transport layer 132 and the Fermi level of the third cathode 133 is less than 0.2 eV, Therefore, this light-emitting structure can reduce the efficiency of electrons injected into the first light-emitting layer 111 to a certain extent, so as to reach a balance with the efficiency of holes injected into the first light-emitting layer 111; improve the efficiency of electrons injected into the second light-emitting layer 121 to a certain extent, so as to reach a balance with the efficiency of holes injected into the second light-emitting layer 121; and reduce the efficiency of electrons injected into the third light-emitting layer 131 to a certain extent, so as to reach a balance with the efficiency of holes injected into the third light-emitting layer 131.

TABLE 2

Energy Level Data Table of Electron Transport Layer

| | Band gap/eV | Energy level of valence band maximum (VBM)/eV | Energy level of CBM/eV |
|---|---|---|---|
| First electron transport layer | 3.69 | −7.52 | −3.83 |
| Second electron transport layer | 3.61 | −7.9 | −4.29 |
| Third electron transport layer | 3.62 | −7.73 | −4.11 |

For example, in some exemplary embodiments, the electron mobility of the third electron transport layer 132 is greater than that of the second electron transport layer 122 and less than that of the second electron transport layer 112. Therefore, this light-emitting structure can further relatively largely reduce the efficiency of electrons injected from the first cathode 113 to the first light-emitting layer 111, slightly reduce the efficiency of electrons injected from the third cathode 133 to the third light-emitting layer 131, and improve the efficiency electron injected from the second cathode 123 to the second light-emitting layer 121, thereby achieving a balance in efficiency of holes and electrons that are respectively injected into the first light-emitting layer 111, the second light-emitting layer 121 and the third light-emitting layer 131, and improving light-emitting efficiency and stability of the light-emitting structure.

For example, in the case where the first electron transport layer 112 is ZnMgO nanoparticles with Mg of 15% in molar percentage, the second electron transport layer 122 is ZnMgO nanoparticles with Mg of 0% in molar percentage, and the third electron transport layer 132 is ZnMgO nanoparticles with Mg of 5% in molar percentage, the electron mobility of the third electron transport layer 132 is larger than that of the second electron transport layer 122 and smaller than that of the first electron transport layer 112.

For example, in some exemplary embodiments, the first light-emitting layer may be a quantum dot light-emitting layer of red, the second light-emitting layer may be a quantum dot light-emitting layer of blue, and the third light-emitting layer may be a quantum dot light-emitting layer of green. The first light-emitting layer can adopt red cadmium-free quantum dot light-emitting material, such as indium phosphide (InP), such as core-shell quantum dot material of InP/ZnS. The second light-emitting layer can adopt blue quantum dot light-emitting material, such as cadmium selenide (CdSe), such as core-shell quantum dot material of CdSe/ZnS. The third light-emitting layer can adopt green cadmium-free quantum dot light-emitting material, such as indium phosphide (InP), such as core-shell quantum dot material of InP/ZnS.

For example, in some exemplary embodiments, as illustrated by FIG. 1, the third light-emitting element 130 further includes a third hole transport layer 134, a third hole injection layer 135, and a third anode 136. The third hole transport layer 134 is disposed at a side of the third light-emitting layer 131 away from the third electron transport layer 132. The third hole injection layer 135 is disposed at a side of the third hole transport layer 134 away from the third light-emitting layer 131. The third anode 136 is disposed at a side of the third hole injection layer 135 away from the third hole transport layer 134.

For example, the third anode 136 may use a transparent conductive oxide or a conductive polymer, and the transparent conductive oxide may be indium tin oxide (ITO), FTO ($SnO_2$), and the like. In addition, the materials of the third hole transport layer 134 and the third hole injection layer 135 can be selected according to the actual situation, and no limitation is imposed here by the embodiment of the present disclosure.

For example, in some exemplary embodiments, as illustrated by FIG. 1, the first light-emitting element 110, the second light-emitting element 120, and the third light-emitting element 130 may be disposed on the base substrate 101 in the same layer. That is, the first anode 116 of the first light-emitting element 110, the second anode 126 of the second light-emitting element 120, and the third anode 136 of the third light-emitting element 130 may be arranged in the same layer; the first hole injection layer 115 of the first light-emitting element 110, the second hole injection layer 125 of the second light-emitting element 120, and the third hole injection layer 135 of the third light-emitting element 130 may be arranged in the same layer; the first hole transport layer 114 of the first light-emitting element 110, the second hole transport layer 124 of the second light-emitting element 120, and the third hole transport layer 134 of the third light-emitting element 130 may be arranged in the same layer; the first light-emitting layer 111 of the first light-emitting element 110, the second light-emitting layer 121 of the second light-emitting element 120, and the third light-emitting layer 131 of the third light-emitting element 130 may be arranged in the same layer; the first electron transport layer 112 of the first light-emitting element 110, the second electron transport layer 122 of the second light-emitting element 120, and the third electron transport layer 132 of the third light-emitting element 130 may be arranged in the same layer. It should be noted that the first hole injection layer 115, the second hole injection layer 125 and the third hole injection layer 135 may have different thicknesses according to actual conditions, and the first hole transport layer 114, the second hole transport layer 124 and the third hole transport layer 134 may have different thicknesses according to actual conditions.

For example, because the first anode 116, the second anode 126, and the third anode 127 can be made of the same material, the first anode 116, the second anode 126 and the third anode 137 may be formed by patterning the same conductive layer.

For example, the base substrate 101 may be a transparent substrate such as a glass substrate, a quartz substrate, a plastic substrate, and the like. The base substrate 101 may also be a flexible transparent substrate such as a polyethylene terephthalate (PET) substrate.

For example, as illustrated by FIG. 1, the light-emitting structure 100 further includes a pixel definition layer 180 located between different light-emitting elements (e.g., between the first light-emitting element 110 and the second light-emitting element 120, between the second light-emitting element 120 and the third light-emitting element 130, and between the third light-emitting element 130 and the first light-emitting element 110).

At least one embodiment of the present disclosure provides a manufacturing method of a light-emitting structure. The manufacturing method includes the following steps S201-S205.

S201: forming a first anode, a second anode, and a third anode on a base substrate.

For example, the method includes forming an anode layer on a base substrate by a deposition method, and then patterning the anode layer to form a first anode, a second anode and a third anode. The base substrate can be a transparent substrate, such as a glass substrate, a quartz substrate, a plastic substrate, etc. The anode layer can adopt a transparent conductive oxide or a conductive polymer, and the transparent conductive oxide may be indium tin oxide (ITO), FTO ($SnO_2$), etc.

S202: forming a first hole injection layer, a second hole injection layer, and a third hole injection layer at a side of the first anode, the second anode, and the third anode away from the base substrate, respectively.

For example, the first hole injection layer, the second hole injection layer, and the third hole injection layer can be formed at a side of the first anode, the second anode, and the third anode away from the base substrate by ink-jet printing or nano-imprinting. Materials of the first hole injection layer, the second hole injection layer, and the third hole injection layer may be organic hole injection materials, such as PEDOT: PSS (poly (3, 4-ethylenedioxythiophene)-polystyrene sulfonic acid), or an inorganic oxide such as molybdenum oxide (MoOx).

S203: forming a first hole transport layer, a second hole transport layer and a third hole transport layer at a position where the first hole injection layer, the second hole injection layer and the third hole injection layer are far away from the substrate. For example, the first, second and third hole transport layers may be organic hole transport materials, such as PVK (polyvinyl carbazole), TFB (poly (9,9-dioctylfluorene —CO—N-(4-butylphenyl) diphenylamine)) and TPD (n, n'-diphenyl-n, n'-) 1'-biphenyl)-4,4'-diamine) and derivatives thereof, or inorganic hole transport materials such as nickel oxide (NiOx) and vanadium oxide (VOx).

S204: forming a first light-emitting layer, a second light-emitting layer, and a third light-emitting layer at a side of the first hole transport layer, the second hole transport layer, and the third hole transport layer away from the base substrate, respectively.

S205: forming a first electron transport layer, a second electron transport layer, and a third electron transport layer at a side of the first light-emitting layer, the second light-emitting layer, and the third light-emitting layer away from the base substrate, respectively.

For example, the first electron transport layer is ZnMgO nanoparticles with Mg of 10%-20% in molar percentage, the second electron transport layer is ZnMgO nanoparticles with Mg less than 5% in molar percentage, and the third electron transport layer is ZnMgO nanoparticles with Mg of 5%-10% in molar percentage.

S206: forming a cathode layer at a side of the first electron transport layer, the second electron transport layer, and the third electron transport layer away from the base substrate.

For example, a cathode layer can be formed at a side of the first electron transport layer, the second electron transport layer, and the third electron transport layer away from the base substrate by evaporation. The material of the cathode layer can be aluminum or silver. A thickness of the cathode layer may be in a range from 100 nm to 150 nm.

At least one embodiment of the present disclosure further provides a display panel. The display panel includes a plurality of light-emitting structures 100 arranged in an array, which are the light-emitting structures provided by the above embodiments. Therefore, the display panel can appropriately reduce the electron injection efficiency of the first light-emitting element so as to be matched with the hole injection efficiency of the first light-emitting element, thereby improving the light-emitting efficiency and stability of the first light-emitting element. In addition, in the case where the display panel adopts the light-emitting structure in which different light-emitting elements adopt different electron transport layers provided by the above embodiments, the display panel can simultaneously improve the light-emitting efficiency and stability of the first light-emitting element, the second light-emitting element, and the third light-emitting element. For details, please refer to the embodiment illustrating the specific description of the light-emitting structure.

At least one embodiment of the present disclosure further provides a display device, which includes the display panel provided by the above embodiments. The display panel can appropriately reduce the electron injection efficiency of the first light-emitting element so as to be matched with the hole injection efficiency of the first light-emitting element, thereby improving the light-emitting efficiency and stability of the first light-emitting element. In addition, in the case where the display panel adopts the light-emitting structure in which different light-emitting elements adopt different electron transport layers provided by the above embodiments, the display panel can simultaneously improve the light-emitting efficiency and stability of the first light-emitting element, the second light-emitting element, and the third light-emitting element. For details, please refer to the embodiment illustrating the specific description of the light-emitting structure.

For example, in some exemplary embodiments, the display device may be any product or component with a display function such as a smart phone, a tablet computer, a television, a displayer, a notebook computer, a digital photo frame, a navigator, etc.

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure; any of those skilled familiar with the related arts can easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. A light-emitting structure, comprising:
   a first light-emitting element comprising a first light-emitting layer, a first electron transport layer, and a first cathode,
   wherein the first cathode is in contact with the first electron transport layer, an energy level of conduction band minimum (CBM) of the first electron transport layer is larger than a Fermi level of the first cathode, and a difference between the energy level of CBM of the first electron transport layer and the Fermi level of the first cathode is in a range from 0.3 to 0.6 eV,
   the energy level of CBM of the first light-emitting layer is smaller than that of the first electron transport layer, the first electron transport layer comprises ZnMgO nanoparticles, and a molar percentage of Mg in the first electron transport layer is in a range from 10% to 20%.

2. The light-emitting structure according to claim 1, wherein the molar percentage of Mg in the first electron transport layer is in a range from 13% to 16%.

3. The light-emitting structure according to claim 1, wherein a material of the first light-emitting layer comprises a red cadmium-free quantum dot material.

4. The light-emitting structure according to claim 3, wherein the material of the first light-emitting layer comprises indium phosphide.

5. The light-emitting structure according to claim 1, further comprising:
   a second light-emitting element comprising a second light-emitting layer, a second electron transport layer, and a second cathode,
   wherein the second cathode is in contact with the second electron transport layer, the energy level of CBM of the first light-emitting layer is smaller than that of the second light-emitting layer, and the energy level of CBM of the first electron transport layer is larger than that of the second electron transport layer.

6. The light-emitting structure according to claim 5, wherein a potential barrier of electrons from the first cathode to the first electron transport layer is larger than a potential barrier of electrons from the second cathode to the second electron transport layer.

7. The light-emitting structure according to claim 5, wherein the energy level of CBM of the first light-emitting layer is smaller than that of the first electron transport layer, the energy level of CBM of the second light-emitting layer is larger than that of the second electron transport layer, and the Fermi level of the second cathode is substantially equal to that of the second electron transport layer.

8. The light-emitting structure according to claim 5, wherein the first electron transport layer comprises ZnMgO nanoparticles, the second electron transport layer comprises ZnO nanoparticles or ZnMgO nanoparticles, and a molar percentage of Mg in the first electron transport layer is greater than a molar percentage of Mg in the second electron transport layer.

9. The light-emitting structure according to claim 8, wherein the molar percentage of Mg in the first electron transport layer is 10%-20%, and the molar percentage of Mg in the second electron transport layer is less than 5%.

10. The light-emitting structure according to claim 5, wherein at least one of the first light-emitting layer and the second light-emitting layer is a quantum dot light-emitting layer, and the first cathode and the second cathode are the same conductive layer.

11. The light-emitting structure according to claim 5, further comprising:
    a third light-emitting element comprising a third light-emitting layer, a third electron transport layer, and a third cathode,
    wherein the third cathode is in contact with the third electron transport layer, and an energy level of CBM of the third light-emitting layer is larger than that of the first light-emitting layer and smaller than that of the second light-emitting layer,
    an energy level of CBM of the third electron transport layer is smaller than that of the first electron transport layer and larger than that of the second electron transport layer.

12. The light-emitting structure according to claim 11, wherein a potential barrier of electrons from the third cathode to the third electron transport layer is larger than a potential barrier of electrons from the second cathode to the second electron transport layer and smaller than a potential barrier of electrons from the first cathode to the first electron transport layer.

13. The light-emitting structure according to claim 11, wherein the first electron transport layer comprises ZnMgO nanoparticles, the second electron transport layer comprises ZnO nanoparticles or ZnMgO nanoparticles, and the third electron transport layer comprises ZnMgO nanoparticles, and a molar percentage of Mg in the third electron transport layer is smaller than a molar percentage of Mg in the first electron transport layer and larger than a molar percentage of Mg in the second electron transport layer.

14. The light-emitting structure according to claim 13, wherein the molar percentage of Mg in the first electron transport layer is in a range of 10%-20%, the molar percentage of Mg in the second electron transport layer is less than 5%, and the molar percentage of Mg in the third electron transport layer is in a range of 5%40%.

15. The light-emitting structure according to claim 11, wherein an electron mobility of the third electron transport layer is larger than that of the first electron transport layer and smaller than that of the second electron transport layer.

16. The light-emitting structure according to claim 5, wherein an electron mobility of the first electron transport layer is smaller than that of the second electron transport layer.

17. The light-emitting structure according to claim 5, wherein the first light-emitting layer is configured to emit light of red and the second light-emitting layer is configured to emit light of blue.

18. A display panel, comprising a plurality of light-emitting structures arranged in an array,
 wherein each of the plurality of light-emitting structures is the light-emitting structure according to claim 1.

19. A display device, comprising the display panel according to claim 18.

* * * * *